United States Patent
Xing et al.

(10) Patent No.: US 6,792,587 B2
(45) Date of Patent: Sep. 14, 2004

(54) 2.5-D GRAPH FOR MULTI-LAYER ROUTING

(75) Inventors: Zhaoyun Xing, San Jose, CA (US); Russell Kao, Portola Valley, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 42 days.

(21) Appl. No.: 10/058,550

(22) Filed: Jan. 28, 2002

(65) Prior Publication Data

US 2003/0145301 A1 Jul. 31, 2003

(51) Int. Cl.[7] .................. G06F 17/50; G06F 17/693
(52) U.S. Cl. ..................... 716/12; 716/13; 716/14; 716/15
(58) Field of Search ............................. 716/1, 7–15

(56) References Cited

U.S. PATENT DOCUMENTS

| | | | | |
|---|---|---|---|---|
| 5,748,844 A | * | 5/1998 | Marks ..................... | 706/45 |
| 5,841,664 A | * | 11/1998 | Cai et al. .................. | 716/14 |
| 6,175,950 B1 | * | 1/2001 | Scepanovic et al. ......... | 716/13 |
| 6,182,272 B1 | * | 1/2001 | Andreev et al. ............ | 716/13 |
| 6,230,306 B1 | * | 5/2001 | Raspopovic et al. ......... | 716/13 |
| 6,292,928 B1 | * | 9/2001 | Yamaguchi et al. ......... | 716/13 |
| 6,324,674 B2 | * | 11/2001 | Andreev et al. ............ | 716/12 |
| 6,353,918 B1 | * | 3/2002 | Carothers et al. ........... | 716/8 |
| 6,415,427 B2 | * | 7/2002 | Nitta et al. ................. | 716/10 |
| 6,477,692 B1 | * | 11/2002 | Marchenko et al. ......... | 716/14 |

OTHER PUBLICATIONS

Wu, Ying–Fung et al., "Rectilinear Shortest Paths and Minimum Spanning Trees in the Presence of Rectilinear Obstacles," IEEE Transactions on computers, vol. C–36, No. 3, Mar. 1987, pp. 321–331.

Zheng, S. Q. et al., "Finding Obstacle–Avoiding Shortest Paths Using Implicit Connection Graphs," IEEE Transactions on Computer–Aided Design of Integrated Circuits and Systems, vol. 15, No. 1, Jan. 1996, pp. 103–110.

* cited by examiner

*Primary Examiner*—Matthew Smith
*Assistant Examiner*—Paul Dinh
(74) *Attorney, Agent, or Firm*—Zagorin, O'Brien & Graham, LLP (57) ABSTRACT

A routing graph (e.g., a 2.5-D graph) and a method for generating same is provided for more efficient multiple-layer path searching and routing. Subgraphs are generated for each layer, and then are combined (e.g., through via connections) into a single, multi-layer graph. The resulting 2.5-dimensional graph may be used in VLSI routing, for example, which commonly includes multiple routing layers in a given design space. Each subgraph corresponds to a layer of circuitry and includes segments based on segments from other layers and intersection points of all such segments. Methods of generating subgraph layers are disclosed.

24 Claims, 5 Drawing Sheets

2.5-D GRAPH FOR MULTI-LAYER ROUTING

BACKGROUND

1. Field of the Invention

The present invention relates to path search techniques and, more particularly, to systems and methods for routing around obstacles such as for integrated circuit (e.g., VLSI) routing.

2. Description of the Related Art

There are many important engineering applications for solutions to the problem of path searching through a space that includes obstacles. The path searching or routing problem typically includes determining a path from a source to a target through a field or area which includes certain obstacles and a clear space around such obstacles. Path searching is often performed in a two-dimensional space covering the search area. In the semiconductor and electronics arts, for example, routing techniques are often employed for layout of conductive traces around obstacles such as circuit elements or devices.

Path searching problems often involve or even require the use of a greater than two-dimensional search space. For example, modern integrated circuit fabrication processes allow up to seven or more layers of metal for routing electrical connections between pins or nodes of a circuit. Therefore, standard two-dimensional solutions for integrated circuit routing (e.g., VLSI routing) are often insufficient.

Existing approaches to solving the multi-dimensional search problem typically suffer from at least one, and sometimes all of the following disadvantages: (i) complexity, (ii) overlong computational time, (iii) failure to achieve an efficient or optimal path when multiple paths exist, (iv) failure to find a path when one exists. Computational efficiency of path search and routing techniques is important, particularly for complex routing problems such as those presented by modern semiconductor technology. The semiconductor routing industry is one industry which is constantly looking to improve techniques for solving this problem so that the above disadvantages are eliminated or at least mitigated.

SUMMARY

A 2.5-dimensional graph may be constructed for more efficient multiple-layer path searching and routing. The construction of a 2.5-dimensional graph may be conceptualized as taking place in two phases: the subgraph generation phase (e.g., for each layer) and a via connection creation phase. The resulting 2.5-dimensional graph may be used in VLSI routing, for example, which commonly includes multiple routing layers in a given design space.

In one embodiment, a method of building a multi-layer graph for greater than two dimensional integrated circuit routing is provided. The method includes the steps of generating subgraphs and combining the subgraphs into a single, multi-layer graph. Each subgraph corresponds to a layer of circuitry. Each of the subgraphs includes segments based on segments from other layers and intersection points of all such segments. A subgraph for a layer may be generated by generating a set to include graph segments from the layer and from other layers. Two sets may be generated, a first set for segments having a first orientation (e.g., horizontal), and a second set for segments having a second orientation (e.g., vertical). Another set including intersection points of graph segments in the first and second sets, and minimal segments from the first and second sets. Points may be marked according to possible coverage by elements in other layers as is discussed in detail herein. The subgraph includes the intersection points as nodes of the subgraph and the minimal segments as edges between the nodes. An integrated circuit may be made by a process including such steps.

In another embodiment, a method of routing through a route space including a plurality of route layers includes the steps of generating a subgraph for each of the routing layers and generating a multi-layer route graph including a plurality of the generated subgraphs. Each subgraph corresponds to a routing layer. Each subgraph includes a plurality of route segments based on information from the corresponding routing layer and a plurality of route segments based on information from other routing layers.

In another embodiment, a product (e.g., a computer program product) for receiving routing data regarding a multi-layer routing problem and for generating a multi-layer graph to facilitate resolution of the routing problem includes a first module for generating a plurality of subgraphs, and a second module for combining all of the plurality of subgraphs into a single, multi-layer graph. Each of the plurality of subgraphs corresponds to each of a plurality of layers of the routing data, and each of the plurality of subgraphs includes a plurality of segments based on information from other layers of the routing data In another embodiment, a 2.5-D graph is used for multi-layer, integrated circuit routing. The 2.5-D graph includes subgraphs corresponding to circuit layers, and each subgraph includes a set of routing segments selected using information from the corresponding circuit layer and at least one other circuit layer.

The foregoing is a summary and thus contains, by necessity, simplifications, generalizations and omissions of detail. Consequently, those skilled in the art will appreciate that the summary is illustrative only and is not intended to be in any way limiting. Other aspects, inventive features, and advantages of the present invention, as defined solely by the claims, will become apparent in the nonlimiting detailed description set forth below.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DESCRIPTION OF THE PREFERRED EMBODIMENT(S)

The following discussion is intended to provide a detailed description of at least one example of the invention and should not be taken to be limiting of the invention itself.

Rather, any number of variations may fall within the scope of the invention which is properly defined in the claims following this description.

Certain design assumptions are made for the routing discussion herein. For example, the routing discussion below assumes rectangular obstacles and Manhattan style routing in a rectangular design space. These and other design assumptions are for simplification to prevent obfuscation of the invention. One of ordinary skill in the art will be able to apply the teachings herein using other design assumptions not required by the claims which follow this discussion.

Figure 1:
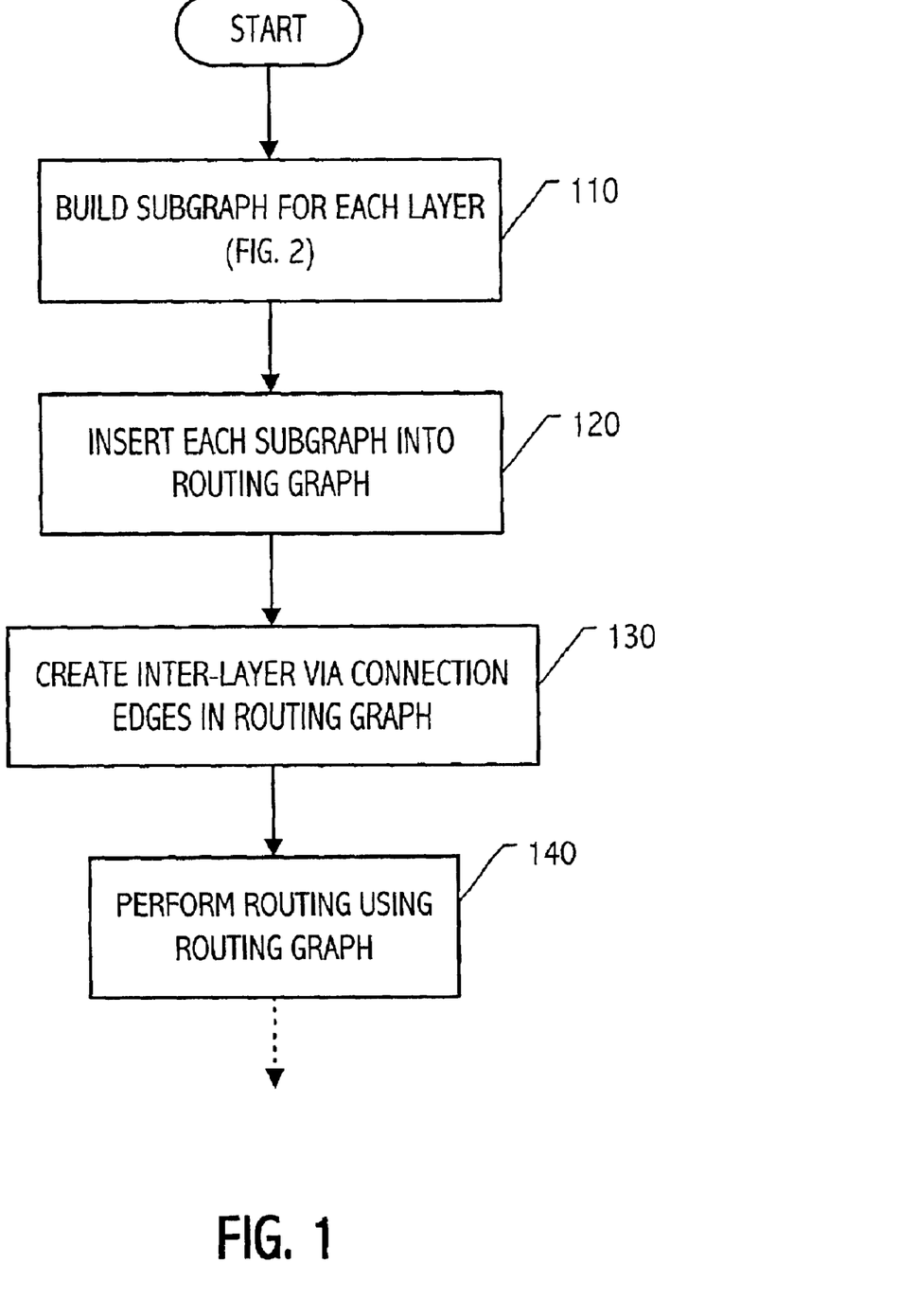
FIG. 1 is a flow chart illustrating a method of developing a multidimensional connection graph.

Referring to FIG. 1, a "subgraph" is built for each layer in which routing is to take place during build subgraphs operation 110. The subgraph for each layer includes horizontal (e.g., x-axis) and vertical (e.g., y-axis) tracks or segments from the layer. A subgraph may be built to include such segments by first constructing a set "L" as a list of horizontal and vertical line segments. The four sides of the design area and the boundary edges of all pins and obstacles are included in set L. For any corner of a pin or obstacle, the maximal horizontal and vertical line segments that end at that corner are also included in set L. A maximal horizontal line segment is defined as a horizontal line segment that crosses neither any obstacle, nor pin, nor any design area boundary. A maximum vertical line segment may be defined similarly in a perpendicular direction. The maximum vertical and horizontal segments can be found by using a line sweep algorithm. To simplify notation, all horizontal segments in set L may be referred to as horizontal graph or subgraph segments, and all vertical segments in L may be referred to as vertical graph or subgraph segments. A set "N" of nodes is defined to include the end points and intersection points of set L. An edge set "E" is defined to include an edge for each segment of set L that passes through those two nodes of set N and there are no other nodes between the two nodes. The subgraph subG may be defined to include sets N and E. In the subgraph, every intersection point of a horizontal segment and vertical segment is a vertex or node, and every segment connecting to neighboring vertices is an edge.

In addition to horizontal and vertical segments from the immediate layer, the subgraph for each immediate layer includes horizontal or vertical segments from both layers above and below (e.g., layers displaced on a z-axis) as is described more fully below. In the presently discussed embodiment, the subgraph for the immediate layer potentially includes information from all layers above and below. This facilitates the use of routing segments of other layers. However, a horizontal or vertical segment of another layer should be clipped or removed from the subgraph if it crosses an obstacle of an in-between layer (i.e., a layer in between the layer of the subgraph and the layer of the segment) because an overlapping portion of the routing segment is not directly available to the current layer. For example, the subgraph for a first layer may include information regarding an x-y location on a seventh layer, unless for example, an obstacle or rectangle of an intervening layer such as the fifth layer covers the same x-y location in the fifth layer. Each layer will include a number of segments, some of which intersect at nodes. Each subgraph includes a number of edges which correspond to segments connecting neighboring nodes.

Generally, the generation of subgraphs for each layer may be conceptualized as taking place in four subphases. The first subphase includes vertical subgraph segment generation (e.g., in the y-direction within each layer). Because tracks from other layers will be clipped by the pins and obstacles in the in-between layers, the vertical segment generation from one layer and layers above are separated from the vertical subgraph segment generation from layers below. A vertical subgraph segment generation algorithm is discussed below with reference to FIG. 3. The second subphase includes horizontal subgraph segment generation. This phase can be analogized to the vertical subgraph segment generation, except that it applies in an orthogonal direction (e.g., the x-direction). In the third subphase, all end points (points where subgraph segments intersect design boundaries) and intersection points (points where horizontal subgraph segments intersect vertical subgraph segments) are marked as the nodes of each subgraph. A via flag is asserted for each node if at least one of the horizontal subgraph segment and the vertical subgraph segment corresponding to the intersection point has its via flag asserted. Via flags are used to aid in the indication that interlayer routing can take place at a corresponding segment or node. In the fourth subphase, an edge is created for any given two nodes if there is a graph segment passing between them and there are no intervening nodes between them. Construction of an exemplary subgraph for each layer is discussed in greater detail below with reference to FIG. 2.

After build subgraph operation 110 and during insert operation 120, each subgraph for each layer is inserted into a routing graph "G" which will become the 2.5-dimensional graph. Thus, the 2.5-dimensional graph, sometimes called the routing graph, includes a subgraph of each layer, and each layer's subgraph includes information regarding portions of other layers which are orthogonally viewable (e.g., not blocked by obstacles in the same x-y space of other layers) from the perspective of the layer of the subgraph.

After insert operation 120 and during via connection operation 130, vias are created between the layers. After each subgraph is generated, every node of each subgraph is checked to see if there is a node juxtaposed in an above layer at a corresponding x-y location. If a via flag is set for both of two juxtaposed nodes, an edge is created in the graph for those two nodes as a potential layer-perpendicular or "z-direction" via at that x-y location. Thus, each interlayer via is represented by an edge in the routing graph. If one of the juxtaposed nodes does not have its via flag set, then no edge is created corresponding to such nodes. In effect, an edge is created if there are overlapping segments of different layers, both of which have their via flags asserted.

Figure 2:
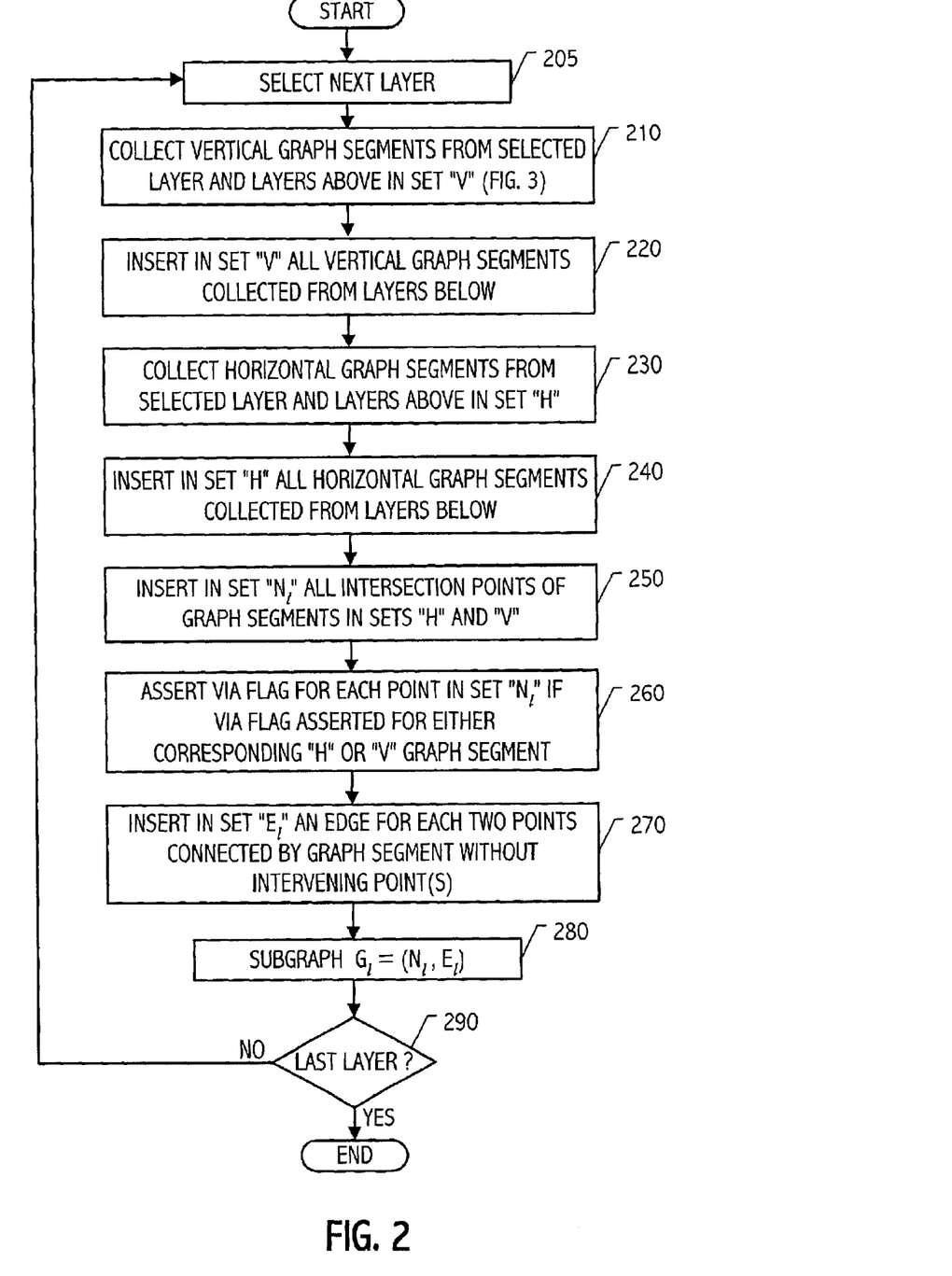
FIG. 2 is a flow chart illustrating a method of generating a subgraph for each layer of a multidimensional search area.

Referring to FIG. 2, a layer is selected during select layer operation 205, and vertical graph segments from the selected layer and layers above the selected layer are collected and placed in a set "V" during collect vertical graph segment operation 210. In the present example, all such vertical graph segments from a selected layer and from all layers above the selected layer are collected and placed in set V. Collect vertical graph segment operation 210 is discussed in detail below with reference to FIG. 3. After collect vertical graph segment operation 210 and during insert vertical graph segment operation 220, all vertical graph segments collected from layers below the selected layer are inserted in set V.

After insert vertical graph segment operation 220 and during collect horizontal graph segment operation 230, horizontal graph segments from the selected layer and layers above the selected layer are collected and placed in set "H". As will be readily appreciated to one of ordinary skill in the art based on the teachings herein, collect horizontal graph segment operation 230 is analogous to collect vertical graph segment operation 210, but operation 230 is applied in a direction perpendicular to operation 210. After collect horizontal segment operation 230 and during insert horizontal graph segments operation 240, all horizontal graph segments are collected from layers below the selected layer and inserted into set H.

After insert horizontal graph segment operation 240 and during insert intersection points operation 250, the various graph segments in sets H and V are analyzed to determine the intersection points of such segments, and such intersection points are inserted in a set "$N_l$" for the current layer l. Each intersection "point" of segments from different layers corresponds to two points or nodes: a first node in the layer of the first segment and a second node in the layer of the second segment.

After insert intersection points operation 250 and during assert via flags operation 260, a via flag is asserted for each point in set $N_L$ if a via flag is asserted for either a corresponding horizontal graph segment or a corresponding vertical graph segment of the layer of the point. After assert via flag operation 260 and during insert edge operation 270, edges are inserted into a set "$E_l$". For example, if there is a vertical or horizontal graph segment crossing each of any given two nodes $P_1$ and $P_2$, and if there are no intervening nodes between them, an edge $P_1P_2$ is inserted into the set $E_l$. Such an edge may be referred to as a minimal edge or minimal segment. Such an edge is only inserted if a via flag was asserted for at least one of points $P_1$ and $P_2$ during operation 260.

After insert edge operation 270 and during subgraph compilation operation 280, the set of intersection points $N_l$ and the set of edges $E_l$ are combined into the routing subgraph for layer l herein designated as $G_l$. Control then transitions to decision 290. Control transitions will next transition to select next layer operation 205 if a new layer is to be selected to build a new subgraph (e.g., if subgraphs have not been built for all layers).

Figure 3:
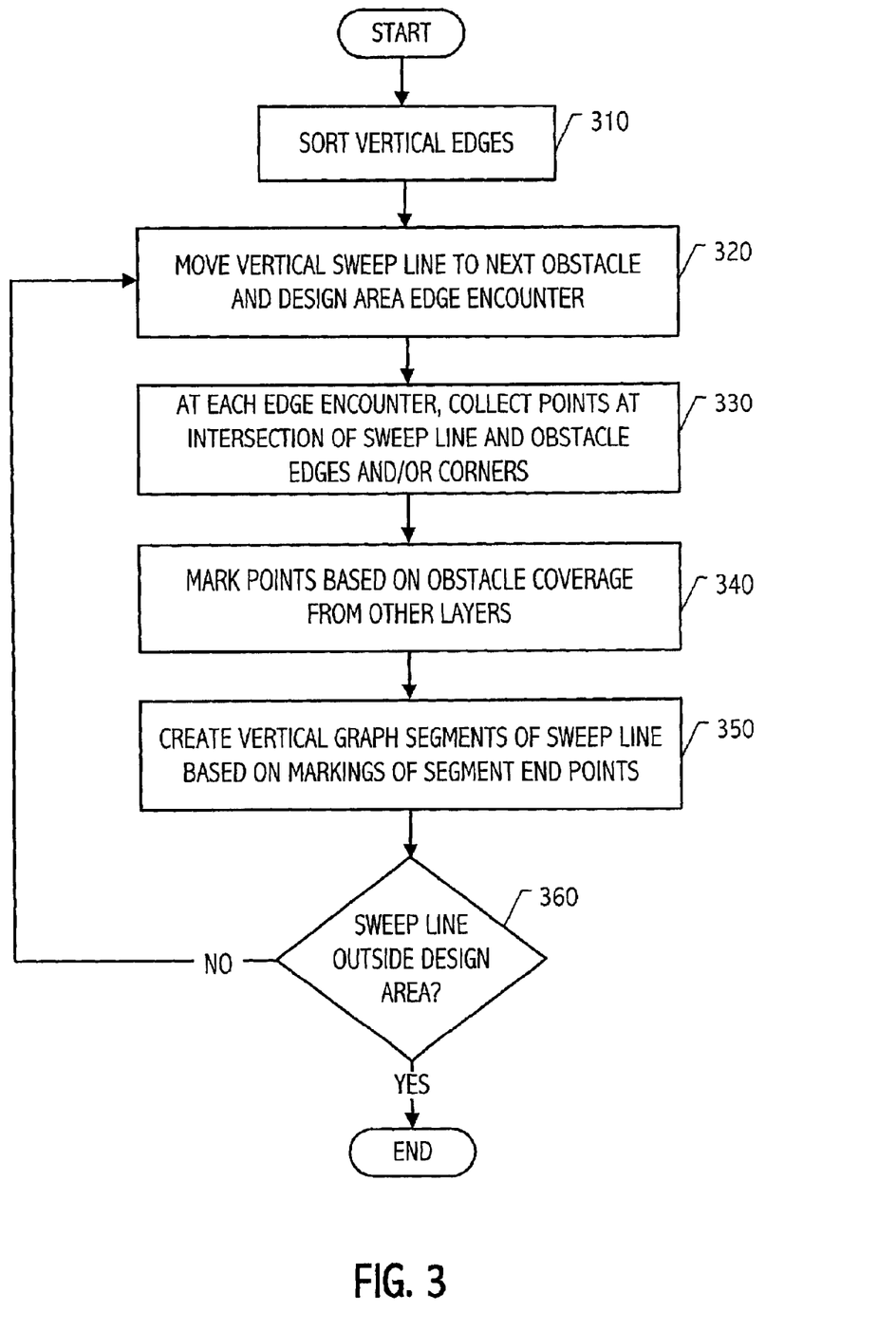
FIG. 3 is a flow chart illustrating a method of collecting subgraph segments for a multidimensional search area.

FIG. 3 shows one embodiment of collect vertical graph segments operation 210. As shown by sort vertical edges operation 310, the described generation of vertical graph segments from one layer and layers above begins with sorting all vertical edges, including two vertical design boundary edges, according to their x-axis position.

Next, during vertical sweep line operation 320, a sweep line is created to guide the vertical graph segment generation. A list is created to keep track of rectangles crossing the sweep line as the sweep line is moved across the design area. As mentioned above, the rectangles discussed herein are representative of any type of obstacle. The sweep line encounters (e.g., is stopped) at each distinct position where it crosses an edge of a rectangle or obstacle in the design area. For example, during a vertical line sweep, a vertical line sweeps in a horizontal direction and stops at every distinct X-position of vertical edges.

Next, during collect points operation 330, all points that are either intersection points of the sweep line and active rectangles or the sweep line and end points of crossing edges are collected. A crossing edge is an edge of a rectangle that is parallel with the sweep line and which is encountered by the swap line. Also, any crossing edge whose rectangle is on a layer closest to the current layer is found. The layer closest to the current layer is called the sweep line edge layer. A balanced tree may be used to keep track of rectangles that are crossing the sweep line. Based on this structure, line segments may be found on the sweep line that connect, for example, two crossing rectangles with one end at a corner of a rectangle. During a vertical line sweep, these line segments are maximal vertical segments on the sweep line. As the sweep line crosses the right edge of a rectangle, the rectangle is removed from the active rectangle list. After the sweep line crosses the right edge of the design area, all maximal vertical segments have been found. Maximal horizontal segments can be found in a similar manner.

Next, the collected points are marked during mark points operation 340. For example, for any point, the closest layer m that has a rectangle covering this point is found. In the presently discussed example, the point is marked GREEN (m) if it is a corner point of the covering rectangle, otherwise it is marked RED(m). A boundary point is marked GREEN (m) if it is not covered by any such rectangle. For example, if a rectangle is on the same layer as the point which it covers, m=1, and the point is marked RED(1) if the portion of the rectangle covering the point is not a corner and is marked GREEN(1) if the portion of the rectangle covering the point is a corner. If the covering rectangle is on the immediately adjacent layer, above or below, m=2. In this case, the point is marked GREEN(2) if it is covered by a corner point of the covering rectangle, or it is marked RED(2) if it is not covered by a corner point of the covering rectangle.

Next, during create vertical subgraph segments operation 350, a check is made of any consecutive two points on the sweep line. If the marking layer m of one point is no lower than the sweep line edge layer and it is not marked red, then a vertical graph segment is created and inserted into the list. A via flag for this graph segment is asserted if either end point has its via flag asserted. If a point is covered by a rectangle (e.g., a pin or other obstacle) in the above layer, and it is not a corner point of the covering rectangle, then a via flag is deasserted (e.g., set, reset, or turned or held off) for this point. This process continues until the sweep line crosses the right boundary of the design area.

Figure 4A:
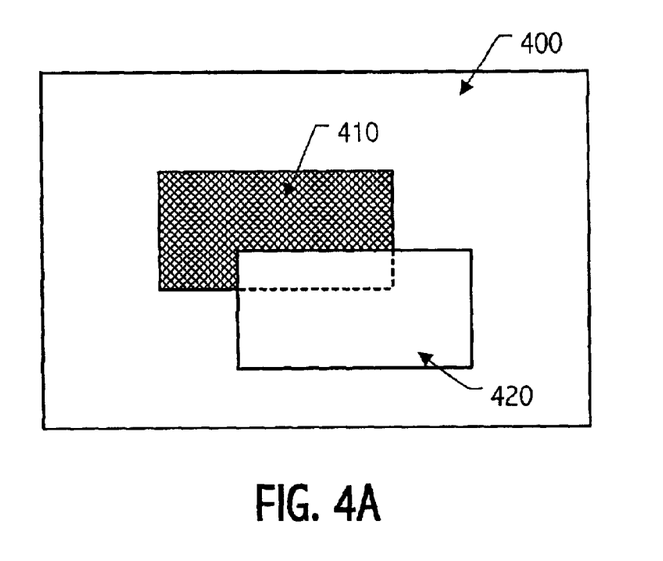
FIG. 4 is a block diagram of a two-level, multidimensional search area having obstacles therein.

A simple two-layer example is useful to demonstrate the generation of vertical graph segments using the above described method. FIG. 4A shows a design space 400 including two obstacles 410 and 420 which in this example are represented by two rectangles. (Design space 400 may sometimes be referred to as a design area.) The cross-hatched rectangle 410 is disposed in a first layer in design space 400. Rectangle 420 is disposed in a second layer in design space 400. The first layer is disposed underneath the second layer, and rectangle 410 is at least partially disposed beneath rectangle 420. Thus, the first and second layers are represented in the figure by the presence of the corresponding rectangles 410 and 420; other features of the first and second layers are not shown for simplicity. The first layer is the layer for which a subgraph will be made. The second layer is the sweep line edge layer described above.

Figure 4B:
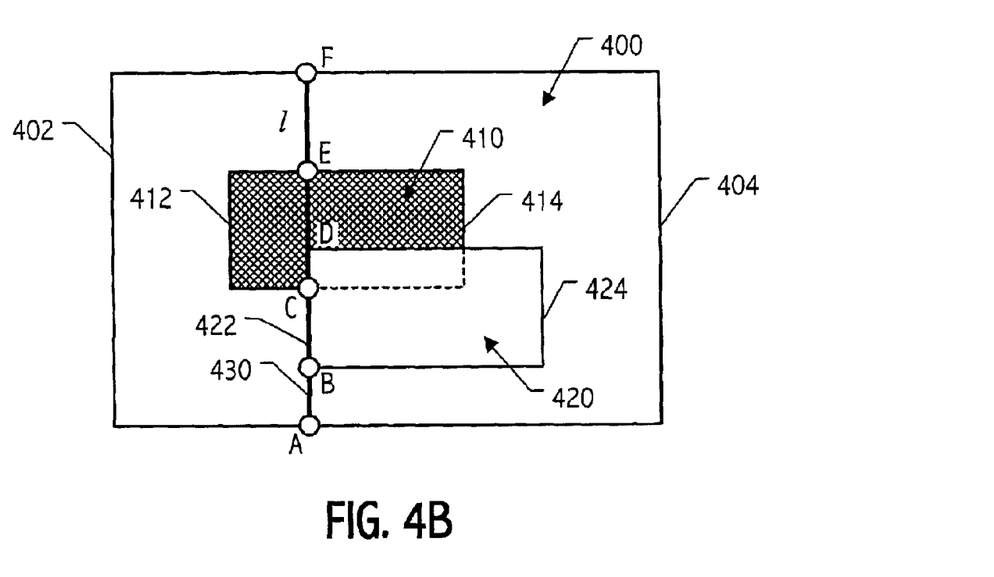

In the present example, vertical subgraph segments are generated for the first layer subgraph. Referring to FIG. 4B, a sweep line 430 moves across design area 400 from left to right during move sweep line operation 320. In the present example, sweep line 430 will stop at six locations including two vertical design boundary edges 402, 404, and four vertical edges of the two rectangles 410 and 420 (e.g., vertical edges 412, 422, 414 and 424 of rectangles 410 and 420). As sweep line 430 stops at a location including point A, the active rectangle list consists of only the first layer rectangle 410. Rectangle 420 of the second layer is about to be crossed by the sweep line. As the sweep line crosses AF, it finds maximal segments AB and EF.

Because the current layer is the first layer (e.g., m=1), and the sweep line edge layer is the second layer (e.g., m=2; if stopping at rectangle of layer 3, then m=3), the marks for the points defined during mark points operation 340 are as follows: A and F are marked GREEN(2). Note that m for points A and F could be any value, and could even be designated with a wildcard value such as an asterisk. Point B is marked GREEN(2) as it is at a point of a rectangle in the second layer. Points C and E are marked GREEN(1) because they border a tile on layer 1. Point D is marked RED(1) because it is within a tile on layer 1 and is blocked.

Points A and B are two consecutive points on the sweep line. Because both are marked green and because the marking layer of each (m=2) is no lower than the sweep line edge layer 2, AB is a vertical subgraph segment. Similarly, segments BC and EF are two vertical subgraph segments because the marking layer or at least one point on each segment is no lower than the sweep line edge layer. The via flag for a segment is determined in the following manner: if the current subgraph is on layer m and the marked color of a point is not RED, then the via flag is asserted for this end point; the via flag is asserted for a segment if either of its end points has its via flag on. In this case, a via flag is asserted for the vertical subgraph segments AB, BC and EF because each has at least one end point with its via flag asserted and because the via flag was not deasserted due to an endpoint being covered by a rectangle in the above layer which is not a corner point of the covering rectangle.

Points C and D are two consecutive points on the sweep line. Because both are marked red and because the marking layer of each (m=1) point is lower than the sweep line edge layer 2, points C and D do not define a vertical subgraph segment. Similarly, segment DE is not a vertical subgraph segment.

The foregoing discussion makes certain design assumptions so as not to obfuscate the invention. For example, it is assumed that the design components such as wires and transistors consist of rectangular-shaped objects. When routing a particular net, objects other than pins of the net are obstacles. Pins are shrunk by half of the desired wire width and obstacles are bloated by the minimum wire spacing plus half of the desired wire width. It is be design rule correct to lay a desired width wire along the pin and obstacle boundaries.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

For example, those skilled in the art will recognize that boundaries between the functionality of the above described operations are merely illustrative. The functionality of multiple operations may be combined into a single operation, and/or the functionality of a single operations may be distributed in additional operations. Moreover, alternative embodiments may include multiple instances of a particular operation, and the order of operations may be altered in various other embodiments.

The operations discussed herein may consist of steps carried out by system users, hardware modules and/or software modules. In other embodiments, the operations of FIGS. 1–3 are directly or indirectly representative of software modules resident on a computer readable medium and/or resident within a computer system and/or transmitted to the computer system as part of a computer program product. Thus, the operations referred to herein may correspond to modules or portions of modules (e.g., software, firmware or hardware modules, or combinations thereof). The functionality of operations referred to herein may correspond to the functionality of modules or portions of modules in various embodiments.

Those skilled in the art will recognize that the boundaries between modules are merely illustrative and alternative embodiments may merge modules or impose an alternative decomposition of functionality of modules. For example, the modules discussed herein may be decomposed into submodules to be executed as multiple computer processes. Moreover, alternative embodiments may combine multiple instances of a particular module or submodule.

The above described method, the operations thereof and modules therefor may be executed on a computer system configured to execute the operations of the method and/or may be executed from computer-readable media. Computer systems may be found in many forms including but not limited to mainframes, minicomputers, servers, workstations, personal computers, notepads, personal digital assistants, various wireless devices and embedded systems, just to name a few. A typical computer system includes at least one processing unit, associated memory and a number of input/output (I/O) devices. A computer system processes information according to a program and produces resultant output information via I/O devices. A program is a list of instructions such as a particular application program and/or an operating system. A computer program is typically stored internally on computer readable storage media or transmitted to the computer system via a computer readable transmission medium. A computer process typically includes an executing (running) program or portion of a program, current program values and state information, and the resources used by the operating system to manage the execution of the process. A parent computer process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Figure 5:
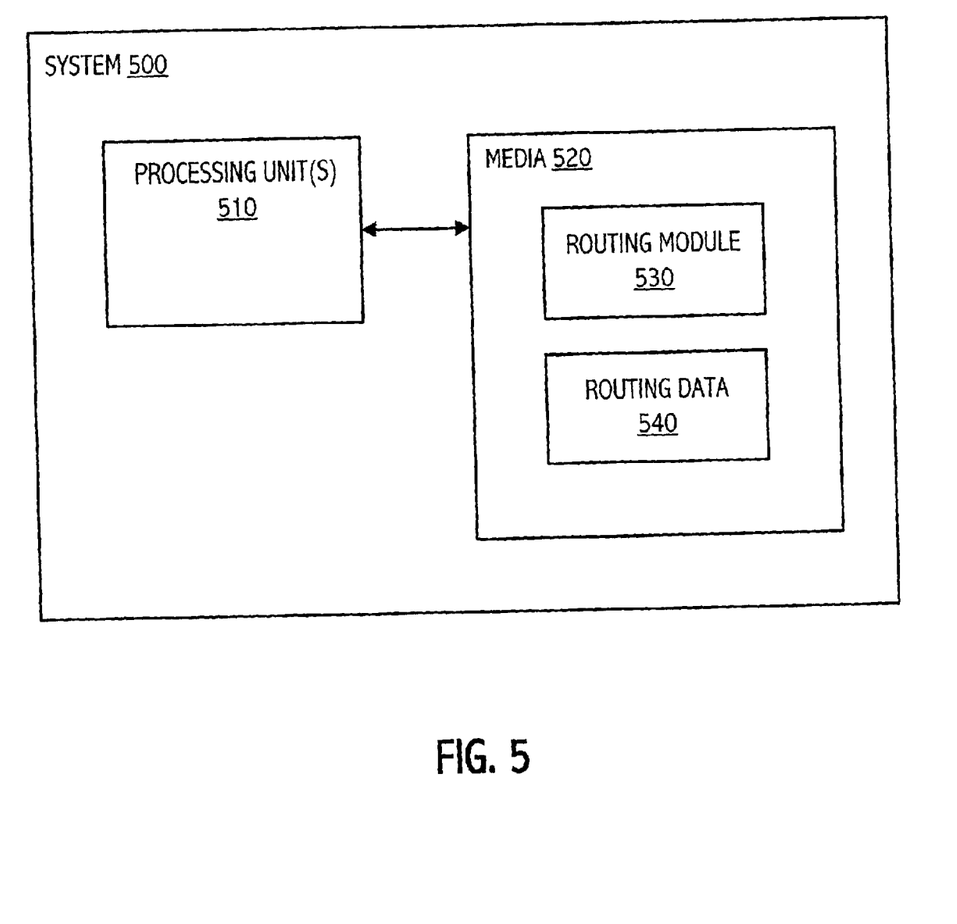
FIG. 5 is a block diagram of an exemplary system for developing a multi-dimensional connection graph.

The method may be embodied in a computer-readable medium for configuring a computer system to execute the method. FIG. 5 shows an exemplary embodiment in which the software modules described above are stored within a computer system 500 on computer readable media 520. For example, the software modules may be stored on media 520 as routing module(s) 530. Routing module(s) 530 are coupled to processing unit(s) 510 to configure system 500 to operate on routing data 540. Routing data 540 may include information pertaining to a design area, design assumptions, objects and space therein; routes and graphs related thereto, etc. Computer readable media 520 may be permanently, removably or remotely coupled to system 500 and/or processing unit(s) 510. Computer readable media 520 may include, for example and without limitation, any number of the following: magnetic storage media including disk and tape storage media; optical storage media such as compact disk media (e.g., CD-ROM, CD-R, etc.) and digital video disk storage media; holographic memory; nonvolatile memory storage media including semiconductor-based memory units such as FLASH memory, EEPROM, EPROM, ROM; ferromagnetic digital memories; volatile storage media including registers, buffers or caches, main memory, RAM, etc.; and data transmission media including permanent and intermittent computer networks, point-to-point telecommunication equipment, and carrier wave transmission media, just to name a few. Other new and various types of computer-readable media may be used to store and/or transmit the software modules discussed herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A method of building a multi-layer graph for greater than two dimensional integrated circuit routing the method comprising:
    generating a plurality of subgraphs, wherein individual ones of the plurality of subgraphs correspond to respective ones of a plurality of layers of circuitry, the individual subgraphs including a plurality of segments based on information from other layers of circuitry; and
    combining the plurality of subgraphs into a single multi-layer graph,
    wherein the generating the plurality of subgraphs comprises the following steps:
        generating a first set to include a plurality of graph segments having a first orientation from a first layer and from any other layers disposed in a first direction from the first layer;
        inserting in the first set a plurality of graph segments having the first orientation from any other layers disposed in a second direction from the first layer;
        generating a second set to include a plurality of graph segments having a second orientation from the first layer and any other layers disposed in a first direction from the first layer; and
        inserting in the second set a plurality of graph segments having the second orientation from any other layers disposed in a fourth direction from the first layer.

2. The method of claim 1 wherein the information from the other layers of circuitry includes segments from the other layers and intersection points of the segments from the other layers.

3. The method of claim 1 further comprising generating the first and second sets for individual ones of the plurality of layers of circuitry.

4. The method of claim 1 wherein the generating the plurality of subgraphs further comprises generating a third set, the third set including intersection points of graph segments in the first and second sets, and minimal segments from the first and second sets.

5. The method of claim 4 further comprising the step of providing a subgraph including the intersection points as nodes of the subgraph and the minimal segments as edges between the nodes.

6. The method recited in claim 1 wherein the first and second orientations are substantially orthogonal.

7. The method recited in claim 1 wherein the first and third directions are substantially identical to each other and substantially orthogonal to the first layer, and the second and fourth directions are substantially identical to each other and substantially opposite to the first and third directions.

8. The method recited in claim 1 wherein the generating the first set comprises:
   recording first information regarding locations of each successive intersection with elements in a first layer while proceeding from a first edge of the first layer to a second edge of the first layer; and
   adding second information regarding coverage of the locations by elements of other layers.

9. The method recited in claim 8 wherein the first information includes a plurality of points at intersections of a sweep line and obstacle edges.

10. The method recited in claim 8 wherein the second information includes a marking of individual ones of the plurality of points indicating possible coverage of the points by elements in other layers disposed in the first direction from the first layer.

11. The method recited in claim 8 wherein the adding of the second information occurs substantially concurrently with the recording of the first information.

12. The method recited in claim 8 wherein the generating the first set further comprises creating vertical graph segments based on the first and second information.

13. An integrated circuit made by a process including the steps of claim 1.

14. A product for receiving routing data regarding a multi-layer routine problem and for generating a multi-layer graph to facilitate resolution of the routing problem, the product comprising:
   a first module for generating a plurality of subgraphs, wherein individual ones of the plurality of subgraphs correspond to respective ones of a plurality of layers of the routing data, the individual subgraphs including a plurality of segments based on information from other layers of the routing data; and
   a second module for combining the plurality of subgraphs into a single, multi-layer graph,
   wherein the first module is a software module and comprises:
      at least one instruction for generating a first set to include a plurality of graph segments having a first orientation from a first layer and from any other layers disposed in a first direction from the first layer;
      at least one instruction for inserting in the first set a plurality of graph segments having the first orientation from any other layers disposed in a second direction from the first layer;
      at least one instruction for generating a second set to include a plurality of graph segments having a second orientation from the first layer and any other layers disposed in a first direction from the first layer; and
      at least one instruction for inserting in the second set a plurality of graph segments having the second orientation from any other layers disposed in a fourth direction from the first layer.

15. The product of claim 14 wherein the first module includes instructions for recording information regarding segments from the other layers and intersection points of the segments from the other layers.

16. The product of claim 14 wherein the first module further comprises at least one instruction for generating a third set, the third set including intersection points of graph segments in the first and second sets and minimal segments from the first and second sets.

17. The product recited in claim 14 wherein the first and second orientations are substantially orthogonal.

18. The product recited in claim 14 wherein the first and third directions are substantially identical to each other and substantially orthogonal to the first layer, and the second and fourth directions are substantially identical to each other and substantially opposite to the first and third directions.

19. The product recited in claim 14 wherein the at least one instruction for generating the first set comprises:
   at least one instruction for recording first information regarding locations of each successive intersection with elements in a first layer while proceeding from a first edge of the first layer to a second edge of the first layer; and
   at least one instruction for adding second information regarding coverage of the locations by elements of other layers.

20. The product of claim 14 wherein
   the product comprises a computer program product encoded in at least one computer readable medium;
   the modules are software modules for processing information for generating the multi-layer graph; and
   the at least one computer readable medium comprises at least one of the group consisting of a data storage medium and a data transmission medium, wherein the data storage medium includes at least one of the group consisting of a magnetic disk, an optical disc and a tape, and the data transmission medium includes at least one of the group consisting of the Internet, a wireline network and a wireless network.

21. A method of routing through a route space including a plurality of route layers, the method comprising the steps of:
   generating a subgraph corresponding to a routing layer and including a plurality of route segments based on information from the corresponding routing layer and a plurality of route segments based on information from other routing layers; and
   generating a multi-layer route graph, the multi-layer route graph based at least in part on wherein the generating the subgraph comprises the following steps:
      generating a first set to include a plurality of graph segments having a first orientation from a first layer and from any other layers disposed in a first direction from the first layer;
      inserting in the first set a plurality of graph segments having the first orientation from any other layers disposed in a second direction from the first layer;
      generating a second set to include a plurality of graph segments having a second orientation from the first layer and any other layers disposed in a first direction from the first layer; and
      inserting in the second set a plurality of graph segments having the second orientation from any other layers disposed in a fourth direction from the first layer.

22. The method of claim 21, wherein the information from the other routing layers includes segments from the other layers and intersection points of the segments from the other layers.

23. The method of claim 21 wherein the generating the subgraph further comprises generating a third set, the third set including intersection points of graph segments in the first and second sets, and minimal segments from the first and second sets.

24. The method of claim 21 wherein the generating the first set comprises:
   recording first information regarding locations of each successive intersection with elements in a first layer while proceeding from a first edge of the first layer to a second edge of the first layer; and
   adding second information regarding coverage of the locations by elements of other layers.

* * * * *

UNITED STATES PATENT AND TRADEMARK OFFICE
CERTIFICATE OF CORRECTION

PATENT NO. : 6,792,587 B2
DATED : September 14, 2004
INVENTOR(S) : Zhaoyun Xing and Russell Kao

It is certified that error appears in the above-identified patent and that said Letters Patent is hereby corrected as shown below:

Column 11,
Line 25, the word "routine" should read -- routing --.

Column 12,
Line 34, the words "in part on wherein" should read -- in part on the subgraph, wherein --.

Signed and Sealed this

Nineteenth Day of April, 2005

JON W. DUDAS
*Director of the United States Patent and Trademark Office*